(12) United States Patent
Morita et al.

(10) Patent No.: US 10,122,342 B2
(45) Date of Patent: Nov. 6, 2018

(54) CRYSTAL VIBRATION DEVICE

(71) Applicant: Murata Manufacturing Co., Ltd., Nagaokakyo-shi, Kyoto-fu (JP)

(72) Inventors: Toru Morita, Nagaokakyo (JP); Toshiyuki Kakuya, Nagaokakyo (JP); Kenji Takayama, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 154 days.

(21) Appl. No.: 15/258,187

(22) Filed: Sep. 7, 2016

(65) Prior Publication Data

US 2016/0380612 A1 Dec. 29, 2016

Related U.S. Application Data

(63) Continuation of application No. PCT/JP2015/051345, filed on Jan. 20, 2015.

(30) Foreign Application Priority Data

Apr. 25, 2014 (JP) ................................ 2014-090843

(51) Int. Cl.
   *H03H 9/08* (2006.01)
   *H01L 41/08* (2006.01)
   (Continued)

(52) U.S. Cl.
   CPC ............... *H03H 9/08* (2013.01); *H01L 23/34* (2013.01); *H03H 9/0552* (2013.01);
   (Continued)

(58) Field of Classification Search
   CPC ...... H01L 41/047; H03H 9/08; H03H 9/0552; H03H 9/1021; H03H 9/132; H03H 9/17; H03H 9/02; H03H 2924/16152
   See application file for complete search history.

(56) References Cited

U.S. PATENT DOCUMENTS

| 7,456,552 B2 | 11/2008 | Chiba et al. |
| 2005/0184626 A1 | 8/2005 | Chiba et al. |

(Continued)

FOREIGN PATENT DOCUMENTS

| CN | 1918783 A | 2/2007 |
| CN | 201541392 U | 8/2010 |

(Continued)

OTHER PUBLICATIONS

International Search Report and Written Opinion issued in International Patent Application No. PCT/JP2015/051345 dated Mar. 3, 2015.

*Primary Examiner* — J. San Martin
(74) *Attorney, Agent, or Firm* — Arent Fox LLP

(57) ABSTRACT

Provided is a crystal vibration device in which it is difficult to transfer heat to a temperature-sensitive element and a crystal vibrator. A crystal vibration device 1 according to the present invention includes: a mounting board 2; connection electrodes 4a and 4b extending on a side surface of the mounting board 2 and reaching an upper surface 2a of the mounting board 2; a first package material 9 provided on the mounting board 2; a crystal vibrator 7 provided on an upper surface 9a of the first package material 9; and a temperature-sensitive element 14 mounted on a lower surface 9b of the first package material 9. Each of the connection electrodes 4a and 4b has a first portion 4A located on the upper surface 2a of the mounting board 2. When a direction in which the first portion 4A of each of the connection electrodes 4a and 4b extends toward an electrode land 5a or 5b is defined as a first direction and a direction orthogonal to the first direction is defined as a second direction in a plan view, a dimension, along the second direction, of a portion of the first portion 4A of each of the connection electrodes 4a and 4b is smaller than a dimension, along the second direction, (Continued)

of a remaining portion of each of the connection electrodes 4a and 4b.

15 Claims, 3 Drawing Sheets

(51) Int. Cl.
    *H01L 23/34*     (2006.01)
    *H03H 9/13*     (2006.01)
    *H03H 9/17*     (2006.01)
    *H03H 9/05*     (2006.01)
    *H03H 9/10*     (2006.01)
    *H01L 23/13*     (2006.01)

(52) U.S. Cl.
    CPC .......... *H03H 9/1021* (2013.01); *H03H 9/132* (2013.01); *H03H 9/17* (2013.01); *H01L 23/13* (2013.01); *H01L 2924/16152* (2013.01)

(56) References Cited

U.S. PATENT DOCUMENTS

| | | | | |
|---|---|---|---|---|
| 2012/0280759 A1* | 11/2012 | Kojo | .................... | H03H 9/1021 |
| | | | | 331/155 |
| 2014/0252919 A1* | 9/2014 | Ariji | .................... | H01L 41/0533 |
| | | | | 310/344 |
| 2014/0368089 A1* | 12/2014 | Omomo | .................... | H03H 3/02 |
| | | | | 310/348 |
| 2015/0123737 A1* | 5/2015 | Yokoo | .................. | H03H 9/0552 |
| | | | | 331/34 |

FOREIGN PATENT DOCUMENTS

| | | |
|---|---|---|
| JP | 2006-050529 A | 2/2006 |
| JP | 2007-049784 A | 2/2007 |
| JP | 2007-235284 A | 9/2007 |
| JP | 2009-105199 A | 5/2009 |
| JP | 2009-194652 A | 8/2009 |
| JP | 2012-074774 A | 4/2012 |
| JP | 2013-102315 A | 5/2013 |

* cited by examiner

CRYSTAL VIBRATION DEVICE

CROSS REFERENCE TO RELATED APPLICATIONS

The present application is a continuation of International application No. PCT/JP2015/051345, filed Jan. 20, 2015, which claims priority to Japanese Patent Application No. 2014-090843, filed Apr. 25, 2014, the entire contents of each of which are incorporated herein by reference.

FIELD OF THE INVENTION

The present invention relates to a crystal vibration device in which a crystal vibrator is mounted on a package material and a temperature-sensitive element is mounted on a lower surface of the package material.

BACKGROUND OF THE INVENTION

Hitherto, a crystal vibration device using a crystal vibrator has been widely used for an oscillator and the like.

By heat being conducted from a surrounding electronic component or the like through a terminal and the like to an IC chip, the temperature of the IC chip having a temperature sensor may suddenly change. Accordingly, the frequency of the crystal vibrator may drift.

In Patent Document 1 described below, the width of a wiring pattern from a terminal to an electrode land on which an IC chip is mounted is made larger than the width of another wiring pattern.

In Patent Document 2 described below, the distance of a heat conduction path from a terminal to an electrode land on which an IC chip is mounted is made equal to the distance of a heat conduction path from the terminal to a crystal vibrator.

In Patent Document 3 described below, a heat conduction path from a terminal to an IC chip and a heat conduction path from the terminal to a piezoelectric vibrator are lengthened. In addition, the heat conduction path from the terminal to the IC chip is made longer than the heat conduction path from the terminal to the piezoelectric vibrator.

Patent Document 1: Japanese Unexamined Patent Application Publication No. 2012-74774

Patent Document 2: Japanese Unexamined Patent Application Publication No. 2013-102315

Patent Document 3: Japanese Unexamined Patent Application Publication No. 2009-105199

SUMMARY OF THE INVENTION

However, when the width of the wiring pattern from the terminal to the electrode land on which the IC chip is mounted is increased as in Patent Document 1, the time taken until heat reaches the IC chip becomes short. Accordingly, the temperature of the IC chip may suddenly change.

In Patent Document 2, the time taken until heat reaches the IC chip from the terminal is made equal to the time taken until heat reaches the crystal vibrator from the terminal. However, a configuration that makes it difficult for heat to reach the IC chip from the terminal is not provided, so that the temperature of the IC chip may suddenly change.

In Patent Document 3, the time taken until heat reaches the IC chip is lengthened by lengthening the heat conduction path from the terminal to the IC chip. However, the structure other than the length of the heat conduction path is not specified in Patent Document 3.

An object of the present invention is to provide a crystal vibration device in which it is difficult to transfer heat to a temperature-sensitive element and a crystal vibrator.

A crystal vibration device according to an aspect of the present invention includes: a mounting board having an upper surface, a lower surface, and a side surface; at least one terminal on the lower surface of the mounting board; at least one connection electrode electrically connected to the at least one terminal and extending on the side surface of the mounting board and reaching the upper surface of the mounting board; at least one electrode land on the upper surface of the mounting board and electrically connected to the at least one connection electrode; a first package material having an upper surface and a lower surface; at least one terminal electrode on the lower surface of the first package material and electrically connected to the at least one electrode land; a crystal vibrator on the upper surface of the first package material; and a temperature-sensitive element mounted on the lower surface of the first package material. The at least one connection electrode has first and second portions. The first portion is on the upper surface of the mounting board and connected to the at least one electrode land. The second portion is on the side surface of the mounting board and connected to the first portion and the at least one terminal. The first portion of the at least one connection electrode extends toward the at least one electrode land in a first direction. The first portion of the at least one connection electrode has a first part and a second part, and the first part is smaller than the second part along a second direction orthogonal to the first direction in a plan view of the crystal vibration device.

In a specific aspect of the crystal vibration device according to the present invention, a resist insulating material is on the upper surface of the mounting board and crosses over at least a portion of the first portion of the at least one connection electrode in the second direction.

In another specific aspect of the crystal vibration device according to the present invention, a cavity is provided in the mounting board, and the temperature-sensitive element is located within the cavity.

In still another specific aspect of the crystal vibration device according to the present invention, the at least one terminal includes first to fourth terminals. The at least one connection electrode includes first to fourth connection electrodes. The at least one electrode land includes first to fourth electrode lands. The at least one terminal electrode includes first to fourth terminal electrodes. The first to fourth terminals are electrically connected to the first to fourth connection electrodes, respectively. The first to fourth connection electrodes are electrically connected to the first to fourth electrode lands, respectively. The first to fourth electrode lands are electrically connected to the first to fourth terminal electrodes, respectively.

In another aspect of the crystal vibration device according to the present invention, the mounting board has a rectangular plate shape. The second portions of the first to fourth connection electrodes are located at corner portions of the mounting board, respectively.

In still another specific aspect of the crystal vibration device according to the present invention, the crystal vibration device further includes a second package material on the upper surface of the first package material. The crystal vibrator is provided within a hollow space formed between the first package material and the second package material.

According to the present invention, it is possible to provide a crystal vibration device in which it is difficult to transfer heat to a temperature-sensitive element.

DETAILED DESCRIPTION OF THE PREFERRED EMBODIMENTS

Hereinafter, specific embodiments of the present invention will be described with reference to the accompanying drawings to clarify the present invention.

Figure 1:
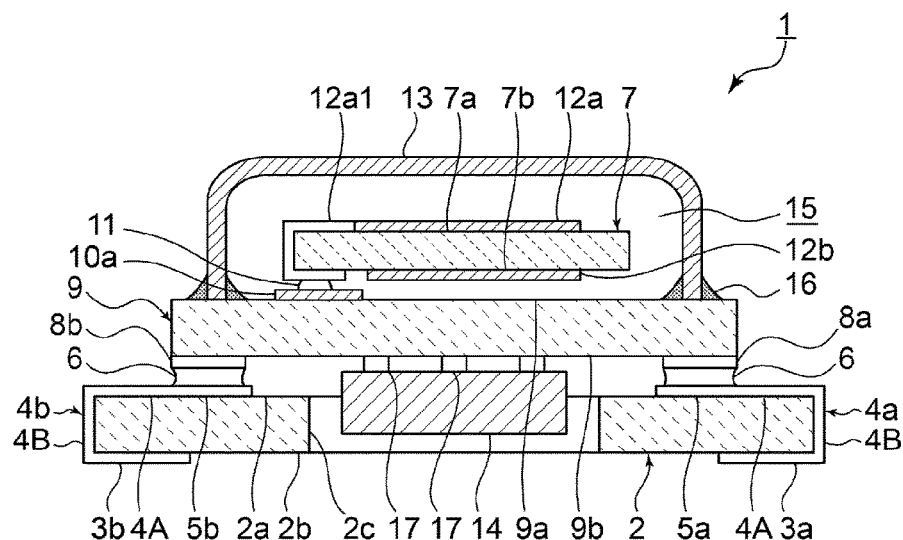
FIG. 1 is a front cross-sectional view of a crystal vibration device according to a first embodiment of the present invention.
Figure 2:
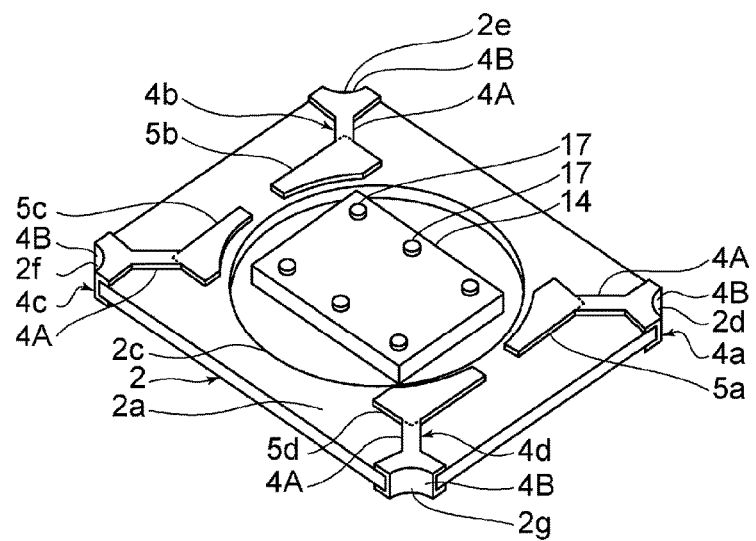
FIG. 2 is a perspective view of a temperature-sensitive element and a mounting board according to the first embodiment of the present invention.

FIG. 1 is a front cross-sectional view of a crystal vibration device according to a first embodiment of the present invention. FIG. 2 is a perspective view of a temperature-sensitive element and a mounting board according to the first embodiment of the present invention.

The crystal vibration device 1 has the mounting board 2. The mounting board 2 has a rectangular plate shape. The mounting board 2 has an upper surface 2a, a lower surface 2b, and a side surface. In addition, the mounting board 2 has a cavity 2c at a center portion thereof.

In addition, in the present embodiment, the mounting board 2 has first to fourth castellations 2d, 2e, 2f, and 2g at corner portions thereof. The mounting board 2 may not have any castellation.

In the present embodiment, the mounting board 2 is a glass epoxy board. The material forming the mounting board 2 is not particularly limited.

First and second terminals 3a and 3b and third and fourth terminals are provided on the lower surface 2b of the mounting board 2. In addition, first to fourth connection electrodes 4a, 4b, 4c, and 4d are provided on the mounting board 2. The first connection electrode 4a and the first terminal 3a are electrically connected to each other. Similarly, the second to fourth connection electrodes 4b, 4c, and 4d are electrically connected to the second terminal 3b and the third and fourth terminals, respectively.

In the present embodiment, the first to fourth connection electrodes 4a, 4b, 4c, and 4d extend on the first to fourth castellations 2d, 2e, 2f, and 2g of the mounting board 2 and reach the upper surface 2a.

First to fourth electrode lands 5a, 5b, 5c, and 5d are provided on the upper surface 2a of the mounting board 2. As shown by a broken line in FIG. 2, the first electrode land 5a and the first connection electrode 4a are electrically connected to each other. Similarly, the second to fourth electrode lands 5b, 5c, and 5d are electrically connected to the second to fourth connection electrodes 4b, 4c, and 4d, respectively.

Each of the first to fourth terminals, the first to fourth connection electrodes 4a, 4b, 4c, and 4d, and the first to fourth electrode lands 5a, 5b, 5c, and 5d is made of an appropriate metal or alloy.

As shown in FIGS. 1 and 2, the first connection electrode 4a has first and second portions 4A and 4B. The first portion 4A of the first connection electrode 4a is located on the upper surface 2a of the mounting board 2. In addition, first portion 4A of the first connection electrode 4a is connected to the first electrode land 5a. The second portion 4B of the first connection electrode 4a is located on the side surface of the mounting board 2. In addition, the second portion 4B of the first connection electrode 4a is connected to the first portion 4A of the first connection electrode 4a and the first terminal 3a. In the present embodiment, the second portion 4B of the first connection electrode 4a is a castellation electrode provided on the first castellation 2d of the mounting board 2. Similarly, each of the second to fourth connection electrodes 4b, 4c, and 4d also has first and second portions 4A and 4B.

An element board 9 that is a first package material is provided on the upper surface 2a of the mounting board 2. In the present embodiment, the element board 9 is composed of a ceramic board. The ceramic material forming the element board 9 is not particularly limited. For example, the element board 9 may be made of an insulating ceramic material such as alumina.

The element board 9 has an upper surface 9a and a lower surface 9b. First and second terminal electrodes 8a and 8b and third and fourth terminal electrodes are provided on the lower surface 9b of the element board 9. The first terminal electrode 8a and the first electrode land 5a, which is provided on the upper surface 2a of the mounting board 2, are electrically connected to each other via a conductive joining material 6. Similarly, the second terminal electrode 8b and the third and fourth terminal electrodes are electrically connected to the second to fourth electrode lands 5b, 5c, and 5d, respectively, via conductive joining materials 6.

Each of the first and second terminal electrodes 8a and 8b and the third and fourth terminal electrodes is made of an appropriate metal or alloy. In addition, each conductive joining material 6 in the present embodiment is composed of solder. Each conductive joining material 6 may be made of an appropriate conductive material such as another conductive adhesive or a metallic brazing material.

A cap 13 that is a second package material is provided on the upper surface 9a of the element board 9. The element board 9 and the cap 13 form a hollow space 15. A crystal vibrator 7 is provided in the hollow space 15.

The cap 13 in the present embodiment is made of a metal. The cap 13 may be made of an appropriate material other than metal.

In the present embodiment, the first package material is the element board 9, and the second package material is the cap 13. The first and second package materials are not limited thereto. For example, a structure may be provided in which a crystal vibrator is mounted on an inner bottom surface of a first package material having an opening opened upward and the upward opening of the first package material is sealed by a cap as a second package material.

The element board 9 and the cap 13 are joined to each other by means of a joining material 16. The joining material 16 is composed of a metallic brazing material such as solder, or an appropriate adhesive.

Figure 3A:
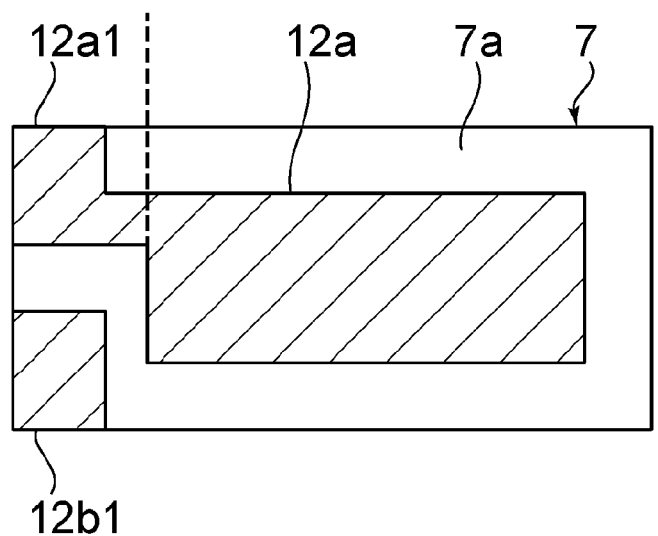
FIG. 3(a) is a plan view showing an electrode shape on the upper surface of the crystal vibrator according to the first embodiment of the present invention.
Figure 3B:
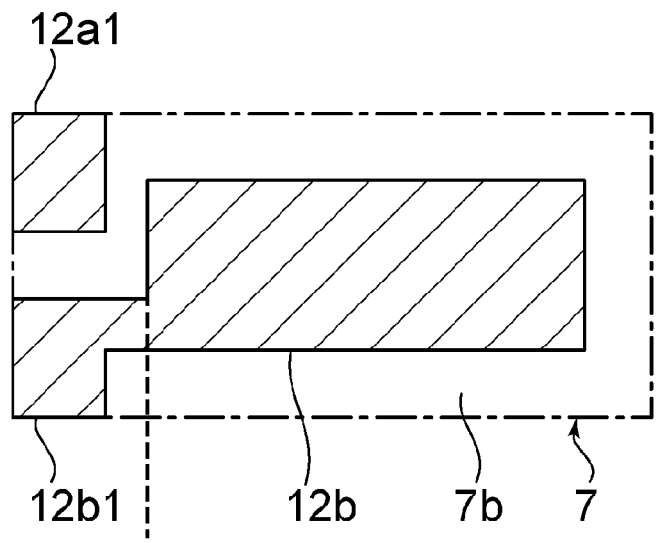
FIG. 3(b) is a plan view showing an electrode shape on the lower surface of the crystal vibrator according to the first embodiment of the present invention by seeing through the crystal vibrator.

FIGS. 3(a) and 3(b) are a plan view showing an electrode shape on the upper surface of the crystal vibrator according to the first embodiment of the present invention and a plan view showing an electrode shape on the lower surface of the crystal vibrator as viewed through the crystal vibrator.

The crystal vibrator 7 has a rectangular plate shape. The crystal vibrator 7 has an upper surface 7a and a lower surface 7b. A first excitation electrode 12a is provided on the upper surface 7a of the crystal vibrator. A first extended electrode 12a1 is connected to the first excitation electrode 12a. The first extended electrode 12a1 extends on a side surface of the crystal vibrator 7 and reaches the lower surface 7b.

In addition, a second excitation electrode 12b is provided on the lower surface 7b of the crystal vibrator 7. A second extended electrode 12b1 is connected to the second excitation electrode 12b. The second extended electrode 12b1 extends on the side surface of the crystal vibrator 7 and reaches the upper surface 7a.

Referring back to FIG. 1, the first extended electrode 12a1 and the second extended electrode on the crystal vibrator 7 are electrically connected to a first electrode land 10a and a second electrode land provided on the upper surface 9a of the element board 9, via conductive joining materials 11, respectively.

Each of the first and second excitation electrodes 12a and 12b, the first extended electrode 12a1, the second extended electrode, the first electrode land 10a, and the second electrode land is made of an appropriate metal or alloy. Each conductive joining material 11 is composed of an appropriate conductive material such as a conductive adhesive or a metallic brazing material.

The crystal vibrator 7 of the present embodiment is supported in a cantilevered manner by the conductive joining materials 11. The crystal vibrator 7 may be supported at both opposing edges thereof.

A temperature-sensitive element is provided on the lower surface 9b of the element board 9. In the present embodiment, the temperature-sensitive element is an IC chip 14 having a temperature sensor. The temperature-sensitive element may be another temperature-sensitive element such as a thermistor.

Figure 4:
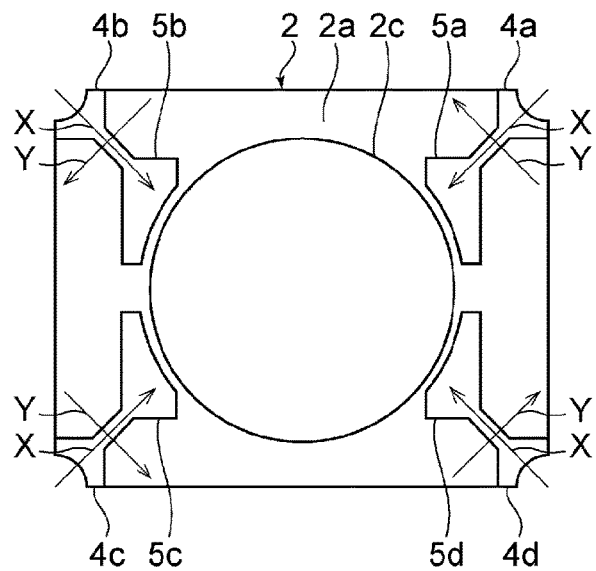
FIG. 4 is a plan view of the mounting board according to the first embodiment of the present invention.

FIG. 4 is a plan view of the mounting board according to the first embodiment of the present invention.

In a plan view, the direction in which the first connection electrode 4a extends toward the first electrode land 5a is defined as a first direction X. In addition, a direction orthogonal to the first direction X is defined as a second direction Y. The first connection electrode 4a has first and second directions X and Y. Similarly, the second to fourth connection electrodes 4b, 4c, and 4d also have first and second directions X and Y.

The present embodiment is characterized in that the dimension, along the second direction Y, of a portion of each of the first portions 4A of the first to fourth connection electrodes 4a, 4b, 4c, and 4d is smaller than the dimension, along the second direction Y, of the remaining portion of each of the first to fourth connection electrodes 4a, 4b, 4c, and 4d. Thus, it is difficult to transfer heat to the IC chip. The reason will be described below.

Referring back to FIGS. 1 and 2, in the crystal vibration device 1, portions into which heat particularly easily flows are the first and second terminals 3a and 3b and the third and fourth terminals at which the crystal vibration device 1 physically contacts the surrounding. Heat flows in through the first and second terminals 3a and 3b and the third and fourth terminals and is transferred to the first to fourth connection electrodes 4a, 4b, 4c, and 4d. The heat is transferred from the first to fourth connection electrodes 4a, 4b, 4c, and 4d to the element board 9. Then, the heat is transferred from the element board 9 to the IC chip 14 and the crystal vibrator 7.

In the present embodiment, the dimension, along the second direction, of the portion of each of the first portions 4A of the first to fourth connection electrodes 4a, 4b, 4c, and 4d is small as described above. Thus, it is possible to decrease the speed at which heat is transferred to the first to fourth connection electrodes 4a, 4b, 4c, and 4d. Accordingly, it is further difficult to transfer heat to the IC chip 14. Therefore, it is possible to further inhibit a sudden change in the temperature of the IC chip 14. Thus, it is possible to further inhibit drift of the frequency of the crystal vibrator 7.

In addition, similarly to the IC chip 14, heat is transferred from the element board 9 to the crystal vibrator 7 according to the present embodiment. Thus, it is possible to make it difficult to transfer heat to the IC chip 14, and it is also possible to make it difficult to transfer heat to the crystal vibrator 7. Furthermore, it is also possible to inhibit a sudden change in the temperature difference between the IC chip 14 and the crystal vibrator 7. Therefore, it is possible to further enhance followability in temperature-correction of the frequency of the crystal vibrator 7.

Furthermore, in the present embodiment, the first to fourth connection electrodes 4a, 4b, 4c, and 4d are exposed in the outer surface. Thus, because of heat dissipation to the outside air, it is further difficult to transfer heat at the first to fourth connection electrodes 4a, 4b, 4c, and 4d.

In the present embodiment, the second portions 4B of the first to fourth connection electrodes 4a, 4b, 4c, and 4d are castellation electrodes and exposed in the outer surface. Thus, the surface areas of the second portions 4B of the first to fourth connection electrodes 4a, 4b, 4c, and 4d that are in contact with the outside air are increased. Accordingly, it is possible to more effectively dissipate heat to the outside air. Therefore, it is further difficult to transfer heat at the first to fourth connection electrodes 4a, 4b, 4c, and 4d.

Meanwhile, in joining an element board and a mounting board by means of a conductive joining material, the melting conductive joining material flows out from first to fourth electrode lands via first to fourth connection electrodes in some cases. Thus, the melting conductive joining material reaches second portions of the first to fourth connection electrodes or the lower surface of the mounting board in some cases.

However, in the present embodiment, the dimension, along the second direction, of the portion of each of the first portions 4A of the first to fourth connection electrodes 4a, 4b, 4c, and 4d is small as described above. Thus, the melting conductive joining material 6 is difficult to flow from the first to fourth electrode lands 5a, 5b, 5c, and 5d via the first portions 4A of the first to fourth connection electrodes 4a, 4b, 4c, and 4d. Accordingly, the melting conductive joining material 6 is difficult to reach the second portions 4B of the first to fourth connection electrodes 4a, 4b, 4c, and 4d and the lower surface 2b of the mounting board 2. Therefore, it is possible to further reduce mounting failures.

The IC chip 14 has a plurality of bumps 17 on the upper surface thereof. The plurality of bumps 17 are joined to electrodes that are provided on the lower surface 9b of the element board 9 and are not shown. In addition, the IC chip 14 is located within the cavity 2c of the mounting board 2. That is, the IC chip 14 is in contact with only the electrodes provided on the lower surface 9b of the element board 9. Thus, it is possible to make a main heat conduction path only as a path from the element board 9. Therefore, it is further difficult to transfer heat to the IC chip 14.

Meanwhile, in joining the element board and the mounting board by means of the conductive joining material, a self-alignment effect is exerted by the melting conductive joining material.

In the present embodiment, as described above, the melting conductive joining material 6 is difficult to flow from the first to fourth electrode lands 5a, 5b, 5c, and 5d. Thus, a self-alignment effect is more effectively exerted. Accordingly, displacement of the positions of the mounting board 2 and the element board 9 on which the crystal vibrator 7 is mounted is further difficult to occur. Therefore, it is possible to further reduce mounting failures.

Figure 5:
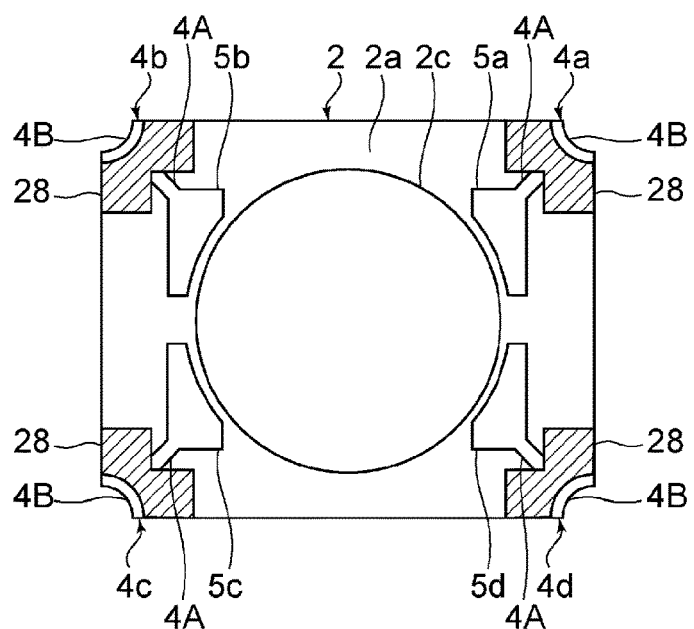
FIG. 5 is a plan view of a mounting board according to a second embodiment of the present invention.

FIG. 5 is a plan view of a mounting board according to a second embodiment of the present invention.

Resist insulating materials 28 are provided on the upper surface 2a of the mounting board 2 so as to cross over portions of the first portions 4A of the first to fourth connection electrodes 4a, 4b, 4c, and 4d, respectively, in the second direction. Thus, when the conductive joining material flows outs from the first to fourth electrode lands 5a, 5b, 5c, and 5d via the first portions 4A of the first to fourth connection electrodes 4a, 4b, 4c, and 4d, it is possible to block the flow of the conductive joining material by the resist insulating materials 28. Accordingly, it is possible to more effectively inhibit the conductive joining material from reaching the second portions 4B of the first to fourth connection electrodes 4a, 4b, 4c, and 4d or the lower surface of the mounting board 2. Therefore, it is possible to further effectively reduce mounting failures.

In the present embodiment, the resist insulating materials 28 are provided so as to cross over the portions of the first portions 4A of the first to fourth connection electrodes 4a, 4b, 4c, and 4d, respectively. However, the portions where the resist insulating materials 28 are provided is not limited to the portions of the first portions 4A of the first to fourth connection electrodes 4a, 4b, 4c, and 4d. For example, the resist insulating materials 28 may be provided so as to cross over the entireties of the first portions 4A of the first to fourth connection electrodes 4a, 4b, 4c, and 4d.

The shape of each of the first to fourth electrode lands provided on the upper surface of the mounting board is preferably the same as the shape of each of the first to fourth terminal electrodes provided on the lower surface of the element board. In this case, in joining the element board and the mounting board by means of the conductive joining material, the self-alignment effect is further effectively is exerted. Thus, displacement of the positions of the mounting board and the element board on which the crystal vibrator is mounted is further difficult to occur. Therefore, it is possible to further effectively reduce failures.

REFERENCE SIGNS LIST 1 crystal vibration device
2 mounting board
2a upper surface
2b lower surface
2c cavity
2d, 2e, 2f, 2g first to fourth castellations
3a, 3b first and second terminals
4a, 4b, 4c, 4d first to fourth connection electrodes
4A, 4B first and second portions
5a, 5b, 5c, 5d first to fourth electrode lands
6 conductive joining material
7 crystal vibrator
7a upper surface
7b lower surface
8a, 8b first and second terminal electrodes
9 element board
9a upper surface
9b lower surface
10a first electrode land
11 conductive joining material
12a, 12b first and second excitation electrodes
12a1, 12b1 first and second extended electrodes
13 cap
14 IC chip
15 hollow space
16 joining material
17 bump
28 resist insulating material

The invention claimed is:

1. A crystal vibration device comprising:
a mounting board having an upper surface, a lower surface, and a side surface;
at least one terminal on the lower surface of the mounting board;
at least one connection electrode electrically connected to the at least one terminal and extending on the side surface of the mounting board and reaching the upper surface of the mounting board;
at least one electrode land on the upper surface of the mounting board and electrically connected to the at least one connection electrode;
a first package material having first surface and a second surface;
at least one terminal electrode on the second surface of the first package material and electrically connected to the at least one electrode land;
a crystal vibrator on the first surface of the first package material;
a temperature-sensitive element on the second surface of the first package material, wherein
the at least one connection electrode having first and second portions, the first portion being located on the upper surface of the mounting board and connected to the at least one electrode land, the second portion being located on the side surface of the mounting board and connected to the first portion and the at least one terminal, the first portion of the at least one connection electrode extending toward the at least one electrode land in a first direction, the first portion of the at least one connection electrode has a first part and a second part, and the first part is smaller than the second part along a second direction orthogonal to the first direction in a plan view of the crystal vibration device; and
a resist insulating material on the upper surface of the mounting board and crossing over at least a portion of the first portion of the connection electrode in the second direction.

2. The crystal vibration device according to claim 1, further comprising a conductive material connecting the terminal electrode to the electrode land.

3. The crystal vibration device according to claim 1, wherein the mounting board defines a cavity, and the temperature-sensitive element is located within the cavity.

4. The crystal vibration device according to claim 1, wherein the at least one terminal includes first to fourth terminals, the at least one connection electrode includes first to fourth connection electrodes, the at least one electrode land includes first to fourth electrode lands, the at least one terminal electrode includes first to fourth terminal electrodes, the first to fourth terminals are electrically connected to the first to fourth connection electrodes, respectively, the first to fourth connection electrodes are electrically connected to the first to fourth electrode lands, respectively, and the first to fourth electrode lands are electrically connected to the first to fourth terminal electrodes, respectively.

5. The crystal vibration device according to claim 4, further comprising first to fourth conductive materials connecting the first to fourth terminal electrodes to the first to fourth electrode lands, respectively.

6. The crystal vibration device according to claim 4, wherein the resist insulating material is a first resist insulating material on the upper surface of the mounting board and crossing over at least a portion of the first portion of the first connection electrode in the second direction, the crystal vibration device further comprising second to fourth resist insulating materials on the upper surface of the mounting board and crossing over at least a portion of the respective first portions of the second to fourth connection electrodes in the second direction.

7. The crystal vibration device according to claim 6, wherein the mounting board has a rectangular plate shape, and the second portions of the first to fourth connection electrodes are located at corner portions of the mounting board, respectively.

8. The crystal vibration device according to claim 7, wherein the corner portions of the mounting board each have a castellation.

9. The crystal vibration device according to claim 4, wherein the mounting board has a rectangular plate shape, and the second portions of the first to fourth connection electrodes are located at corner portions of the mounting board, respectively.

10. The crystal vibration device according to claim 9, wherein the corner portions of the mounting board each have a castellation.

11. The crystal vibration device according to claim 1, wherein the mounting board has a rectangular plate shape, and the second portion of the at least one connection electrode is located at a corner portion of the mounting board.

12. The crystal vibration device according to claim 11, wherein the corner portion of the mounting board has a castellation.

13. The crystal vibration device according to claim 1, further comprising a second package material on the first surface of the first package material and defining a space between the first package material and the second package material, and the crystal vibrator is provided within the space.

14. The crystal vibration device according to claim 1, wherein the temperature-sensitive element is an IC chip having a temperature sensor.

15. The crystal vibration device according to claim 14, wherein the mounting board defines a cavity, and the temperature-sensitive element is located within the cavity.

* * * * *